United States Patent [19]
Takayama et al.

[11] Patent Number: 5,877,559
[45] Date of Patent: Mar. 2, 1999

[54] FILM CARRIER FOR FINE-PITCHED AND HIGH DENSITY MOUNTING AND SEMICONDUCTOR DEVICE USING SAME

[75] Inventors: Yoshinari Takayama; Kazuo Ouchi; Atsushi Hino, all of Ibaraki, Japan

[73] Assignee: Nitto Denko Corporation, Osaka, Japan

[21] Appl. No.: 689,234

[22] Filed: Aug. 6, 1996

[51] Int. Cl.⁶ .................................................. H01L 23/48
[52] U.S. Cl. ........................ 257/773; 257/774; 257/777; 257/737
[58] Field of Search .................................... 257/773, 774, 257/777, 778, 737, 738, 753

[56] References Cited

U.S. PATENT DOCUMENTS

| | | | |
|---|---|---|---|
| 4,499,655 | 2/1985 | Anthony | 257/774 |
| 5,136,359 | 8/1992 | Takayama et al. | 247/774 |
| 5,433,822 | 7/1995 | Mimura et al. | 257/737 |
| 5,434,452 | 7/1995 | Higgins, III | 257/774 |
| 5,468,681 | 11/1995 | Pasch | 257/737 |
| 5,470,790 | 11/1995 | Myers et al. | 257/774 |
| 5,559,372 | 9/1996 | Kwon | 257/773 |

FOREIGN PATENT DOCUMENTS

| | | | |
|---|---|---|---|
| 0544305 | 6/1993 | European Pat. Off. | 257/737 |
| 0 702 404 | 3/1996 | European Pat. Off. | |

*Primary Examiner*—David B. Hardy
*Attorney, Agent, or Firm*—Sughrue, Mion, Zinn, Macpeak & Seas, PLLC

[57] ABSTRACT

In a film carrier with a conductive circuit formed, an opening is formed in a particular position relative to where the conductive path is to be formed. The opening is a through-hole, filled with a conductive material to form a conductive path. The conductive circuit has a concave face, provided according to certain formulae. The film carrier can cope with a fine-pitched and highly dense mounting, while prohibiting pulling out of the conductive path by an external force. The film carrier does not suffer from fallout of the conductive path, and has increased electrical connection reliability.

9 Claims, 5 Drawing Sheets

FILM CARRIER FOR FINE-PITCHED AND HIGH DENSITY MOUNTING AND SEMICONDUCTOR DEVICE USING SAME

FIELD OF THE INVENTION

The present invention relates to a film carrier to be used for counting a semiconductor element, and a semiconductor device comprising a semiconductor element mounted on said film carrier.

BACKGROUND OF THE INVENTION

A semiconductor element has been conventionally mounted by a film carrier method. According to this film carrier method, semiconductor chips are connected via bumps to a film carrier tape which functions as a member for carrying a semiconductor element or for packaging same. A bump is a conductive protruding connection which is formed on an electrode surface of a semiconductor element as an inner bonding means to connect a lead on a film carrier and the electrode of the semiconductor element.

When forming a bump on the electrode surface of a semiconductor element, an adhesive metal layer of, for example, titanium and chromium, and a barrier metal layer of, for example, copper, platinum and palladium for the prevention of diffusion of bump metals, need to be formed on the electrode surface by sputter-etching, evaporation deposition and the like, and a bump of gold, etc. is formed thereon. As a result, the fabrication becomes extremely complicated. In addition, the semiconductor element and the electrode surface may be contaminated or damaged while forming bumps on the electrode surface.

It is suggested, therefore, to use, as a method not including a bump on the electrode surface of a semiconductor element, a method using a film having conductivity in the direction of the thickness of the film, i.e., a so-called anisotropic conductive film. Examples of such anisotropic conductive film include those containing conductive particles, such as carbon black, graphite, nickel, copper and silver, oriented in an insulating film in the direction of the film thickness and dispersed therein. However, this anisotropic conductive film is associated with difficulties in that insufficient orientation of the conductive particles leads to an uncertain electrical connection between the lead on the film carrier and the electrode of the semiconductor element, which in turn causes poor connection reliability.

It is also proposed to form a bump on the lead side of a film carrier to form a direct connection to the electrode of the semiconductor element. This method cannot cope with a fine-pitched or highly dense wiring of a semiconductor element, due to a difficulty in forming a circuit or bump necessary for such semiconductor element, as well as high level of caution necessary during connection operation.

In addition, a film carrier having a conductive circuit and a lead on the surface of an insulating film may be used. However, this method is again associated with potential difficulty in coping with miniaturization of semiconductor elements, since the area of outer lead bonding routinely becomes greater than the area of inner lead bonding, thereby making the final mounting area greater than the area of the semiconductor element.

A semiconductor element mounted on a film carrier is often protected by molding and sealing same with an insulating resin. When the film carrier has an exposed conductive circuit, however, an insulating sealant resin directly contacts said conductive circuit. The metal constituting the conductive circuit and the insulating resin adhere poorly to each other, allowing water in the air and other substances to intrude into the interface of the two to possibly degrade the reliability of the semiconductor device obtained.

Thus, a film carrier has been proposed which can sufficiently cope with a fine-pitched or highly dense wiring of a semiconductor element, can provide positive connections both in inner lead bonding and outer lead bonding, and which can make the mounting area as small as possible. The structure of this film carrier is that wherein a conductive circuit is not formed on an insulating film but completely embedded in the insulating film, an opening is formed in the insulating film to expose the surface of the embedded conductive circuit, and a conductor is filled in said opening to form a conductive path to allow electrical connection between the conductive circuit and the electrode of a semiconductor element or the landing part of an external substrate via the surface of this conductive path.

This structure is again associated with a problem in that the conductive path may come off from the insulating film when a defective semiconductor element is replaced after connection with the external substrate using solder, etc., due to a low adhesion strength between said conductive path and conductive circuit.

It is therefore an object of the present invention to solve the above-mentioned problems and provide a film carrier capable of sufficiently coping with a fine-pitched or highly dense wiring of a semiconductor element, providing reliable connections both in inner lead bonding and outer lead bonding, and decreasing the mounting area to the greatest possible extent, which provides superior adhesion between bumps and conductive circuits and enables suitable repair action.

Another object of the present invention is to provide a semiconductor device having the characteristics of the film carrier of the present invention after connection of the film carrier to a semiconductor element.

SUMMARY OF THE INVENTION

The film carrier of the present invention is characterized in that a conductive circuit is formed on one side or inside of an insulating substrate, and when the conductive circuit is formed on one side of the insulating substrate, an opening is formed on the other side of said insulating substrate at a position where a conductive path is to be formed, and when the conductive circuit is formed inside the insulating substrate, an opening is formed on one side or both sides of said insulating substrate at a position where a conductive path is to be formed, said opening comprising a through-hole extending from the surface of the insulating substrate to the surface of the conductive circuit, and a concave formed on the face of the conductive circuit about the opening at the lower end of said through-hole, in a diameter equally extended all around said opening, and said opening being filled with a conductive material to form a conductive path.

The most preferable concave satisfies the following requirements (A)–(C):

(A) $Y \leq Z/2$ wherein Y is a length in the direction of the thickness of the conductive circuit, which is from the lower edge of the through-hole to the bottom of the concave, and Z is a thickness of the conductive circuit when a concave is not formed, (B) X<W/2 wherein X is a distance from the lower edge of the through-hole to the outer periphery of the concave, and W is a distance from the lower edge of the through-hole to the end of the conductive circuit in the direction of X, and (C) $⅓ ≦ X/Y ≦ 1$ wherein Y is as defined in the above (A) and X is as defined in the above (B).

The semiconductor device of the present invention comprises an electrode of the semiconductor element connected to the contact part of the film carrier of the present invention.

The "semiconductor element" as used in the present invention encompasses an assembly of semiconductor elements as a matrix on a silicon wafer and individual silicon chips after dicing same, a circuit substrate for mounting on a semiconductor device, a circuit substrate for LCD, and a fine-pitched circuit substrate such as hybrid IC, and a "conductive circuit" denotes a wide concept inclusive of not only wiring patterns, but also electrode lead and the like.

DETAILED DESCRIPTION OF THE INVENTION

The film carrier of the present invention is explained in more detail in the following by referring to illustrative Figures.

Figure 1:
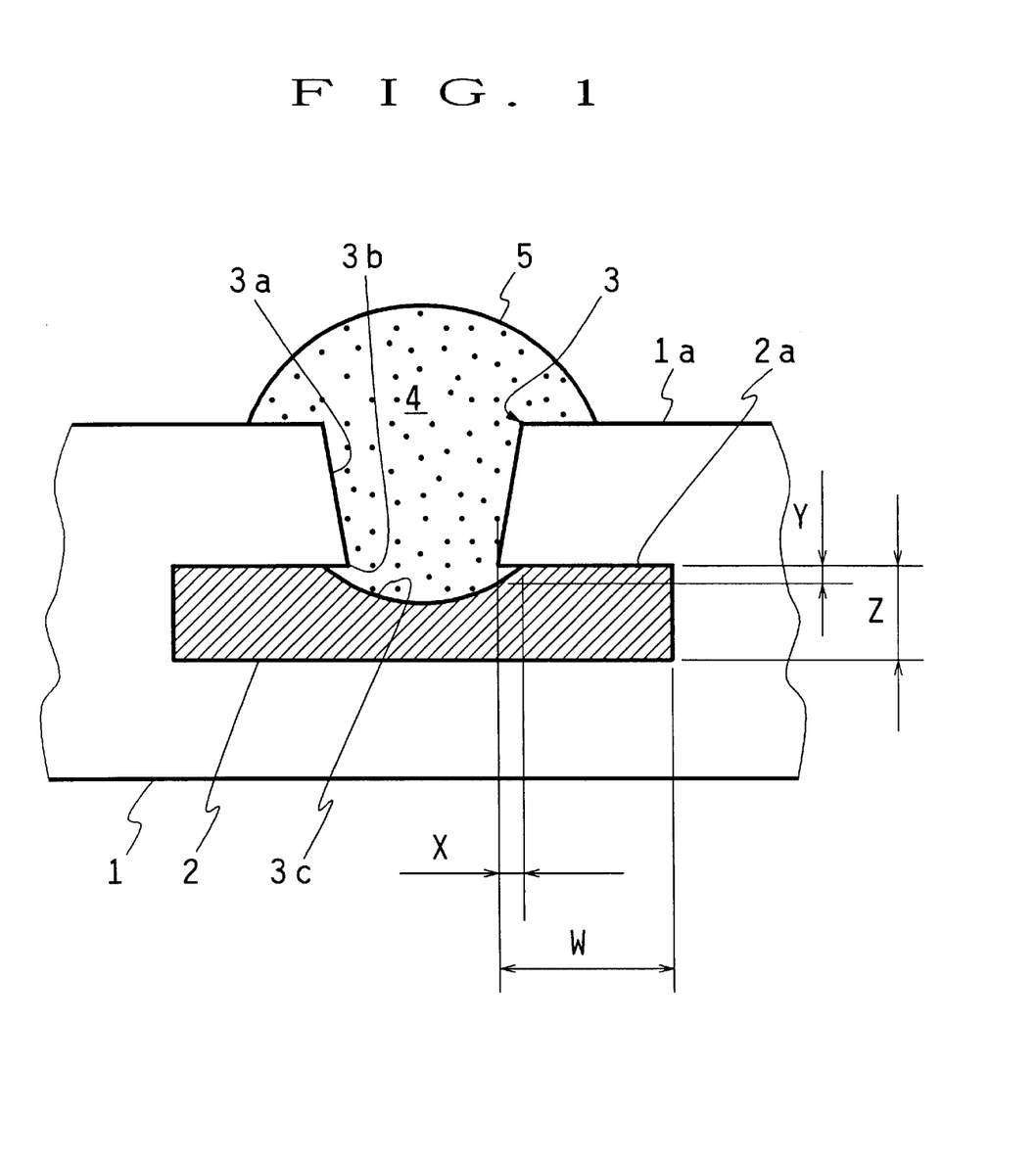
FIG. 1 is a schematic showing of one embodiment of the film carrier of the present invention.

FIG. 1 is a schematic showing of one embodiment of the film carrier of the present invention, which is a cross section along the line of the lengthwise axis of the opening. This embodiment shows a film carrier of the present invention having an opening only on one side of the insulating substrate. As shown in FIG. 1, the structure of the film carrier of the present invention is such that a conductive circuit 2 is formed inside an insulating substrate 1, an opening 3 is formed at a desired position on one side of said insulating substrate 1, the conductive circuit is exposed at the bottom of the opening 3, and a conductive material is filled in said opening to form a conductive path 4. The upper end of the conductive path 4 functions as a contact part 5 to make an electric connection with external contact objects. In this embodiment, the conductive material filled in the opening protrudes from the surface of the insulating substrate to form a bump to be a contact part 5.

The opening 3 consists of a through-hole 3a extending from a surface 1a of the insulating substrate 1 to a surface 2a of the conductive circuit 2, and a concave formed on the face of the conductive circuit about the opening at the lower end of said through-hole in a diameter equally extended all around said opening, wherein the through-hole and the concave form a mushroom shape. In FIG. 1, only the conductive circuit 2 is hatched.

This construction affords the following advantages.

① The conductive path formed by filling a conductive material in the opening has a greater outer diameter at the concave part than the diameter of the through-hole, and the concave acts as a burr relative to the insulating substrate to prevent the conductive path from easily coming off from the opening.

② By meeting the above requirements (A)–(C) in determining the shape and size of the concave relative to the conductive circuit, the concave filled with a conductive material comes to constantly have an optimal mechanical strength in conformity with the size of the conductive circuit, while constantly maintaining superior contact with the conductive circuit.

The requirement ② is explained in more detail in the following.

For example, as shown in FIG. 1, when the length in the direction of the thickness of the conductive circuit, which is from the lower edge of the through-hole 3a to the bottom of a concave 3c, is Y and the thickness of the conductive circuit when a concave is not formed is Z, Y is preferably always not more than ½ of Z. When Y is greater than ½ of Z, the concave may disadvantageously penetrate the conductive circuit.

When the distance from the lower edge of the through-hole 3a to the outer periphery of the concave 3c is X and the distance from the lower edge of the through-hole to the end of the conductive circuit in the direction of X is W, X is preferably always not more than ½ of W. When X is greater than ½ of W, the adhesion between the insulating substrate and conductive circuit becomes problematically low.

When Y is greater than ½ of Z and X is greater than ½ of W, an agent used for etching treatment reacts with the conductive circuit in a non-uniform manner and causes inconsistent sizes of the concaves. As a consequence, when a conductive material is filled in the opening and allowed to protrude from the surface of the insulating substrate to form a bump, the vertical distance from the surface of the insulating substrate to the bump top, i.e., bump height, varies, thus degrading contact reliability.

Moreover, X/Y is preferably not less than ⅓ and not more than 1. When X/Y is less than ⅓, the shortness of X makes catch on the insulating substrate smaller. As a result, a tensile strength becomes low, so that the conductive path tends to come off easily from the opening. When X/Y is greater than 1, X is long but Y becomes short, so that a shear strength becomes small.

The material of the insulating substrate is not subject to any particular limitation as long as it can stably support the internal conductive circuit, conductive path from the inside to the surface, and in some cases, bumps on the surface, and is substantially electrically insulating. Specific examples include various thermosetting resins and thermoplastic resins such as polyester resin, epoxy resin, urethane resin, polystyrene resin, polyethylene resin, polyamide resin, polyimide resin, acrylonitrile-butadiene-styrene copolymer resin (ABS resin), polycarbonate resin, silicone resin and fluororesin, with preference given to polyimide resin in view of the superior heat resistance, dimensional stability on heating and mechanical strength.

While the thickness of the insulating layer is not particularly limited, it is about 2–500 μm, preferably about 5–150 μm, to achieve sufficient mechanical strength and flexibility.

The conductive circuit may be formed inside the insulating substrate or on the substrate on the side without the opening.

The material of the conductive circuit is subject to no particular limitation as long as it has conductivity, and is exemplified by various metals. Preferred is copper since it has smaller resistance and can reduce the width of wiring area to realize finer pitches and send signals at higher speeds.

While the thickness of the conductive circuit is not particularly limited, it is generally about 1–200 µm, preferably about 5–80 µm.

The shape and size of the opening can be determined in consideration of the width of the conductive circuit contained inside, according to the structure wherein, for example, a conductive material is filled in the opening and the opening of the insulating substrate is used as a contact part, or wherein a bump is formed and the opening is used as a conductive path between the bump and the conductive circuit.

The shape of the through-hole is mainly columnar or a circular cone.

The size of the opening on the surface of the insulating substrate is preferably about 5 µm–200 µm, preferably 3 µm–100 µm.

The shape of the concave to be formed as a part of the opening in the conductive circuit may be any as long as it has greater dimeter than the diameter of the lower end of the through-hole, and may be, for example, a semi-sphere or trapezoid.

The opening may be formed by a known method generally used for making an opening in a substrate. Since the through-hole and the concave are formed from different materials, they may be formed by different methods.

For example, the through-hole may be formed by, for example, mechanical processing such as punching, photolithographic processing, plasma processing, chemical etching processing and laser processing, with preference given to laser processing which enables elaborate processing required for fine-pitched products. In particular, the use of an ultraviolet laser having an oscillation wavelength in the ultraviolet range is preferable.

The concave in the conductive circuit can be formed by, for example, dry etching using $CO_2$ laser or wet etching such as chemical etching and electrolytic etching. When the conductive circuit is made from a metal, chemical etching is preferable which affords uniform etching and is superior in mass production. In chemical etching, the depth and outer diameter of the concave, in particular, X and Y mentioned above, are adjusted by varying liquid components, temperature, time, the amount and manner of liquids applied and the like.

Figure 2:
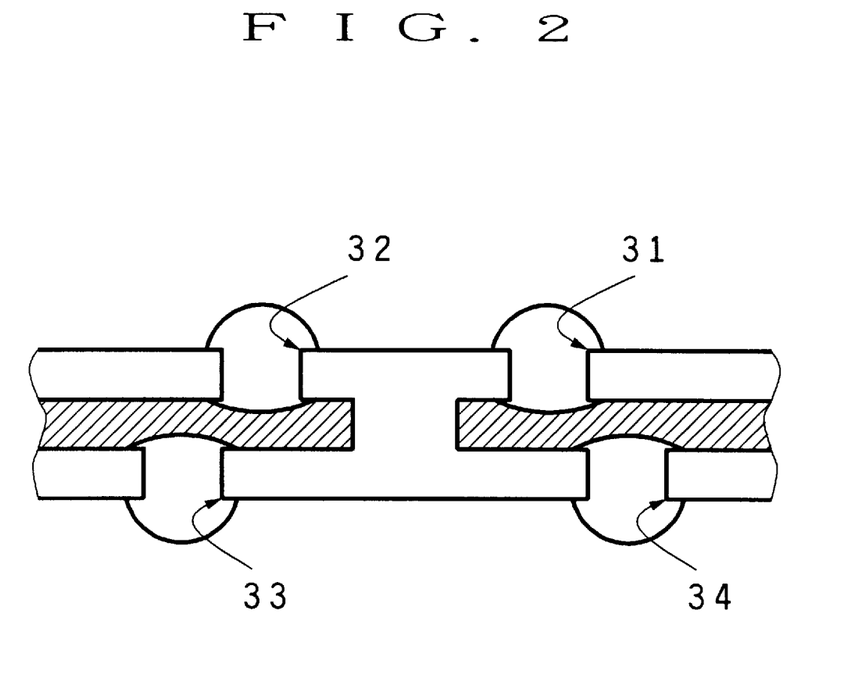
FIG. 2 is a schematic showing of another embodiment of the film carrier of the present invention wherein openings are formed on both sides of an insulating substrate.

When the conductive circuit is formed inside the insulating substrate, the opening may be formed on both sides of the insulating substrate. Alternatively, as shown in FIG. 2, a conductive circuit may be made between the concaves of a desired combination of, from among the openings on both sides of substrate, 31 and 34, or 32 and 33. This construction provides a superior film carrier which conducts in the direction penetrating the plane of the insulating substrate.

The conductive material to be filled in the opening is subject to no particular limitation as long as it has conductivity, and may be known metallic materials, such as gold, silver, copper, platinum, zinc, tin, nickel, cobalt, indium, rhodium, chromium, tungsten and ruthenium, and various alloys containing same as components (e.g., solder, nickel-tin and gold-cobalt).

When a conductive material is filled in the opening and a protrusion thereof is used as a bump, the material to be used for filling in the opening and the material of the bump may be the same or different and are determined according to the object.

In FIG. 1, for example, the conductive path 4 including the concave 3c to be connected to the conductive circuit 2 is made from an economical metal having lower resistance, such as copper, and the surface layer of bump 5 to be in contact with the electrode of a semiconductor element is made from a material reliable in connection performance, such as gold.

When the bump 5 and an external electrode are connected via solder, in particular, the surface layer of the bump is formed using a material which becomes easily wet to the solder, such as gold, platinum and tin, and a material which hardly becomes wet to the solder, such as nickel, tungsten and tantalum, is preferably used in between the surface layer of the bump and the conductive path.

The method for filling a conductive material in the opening includes, for example, plating method such as electrolytic plating and electroless plating, CVD, chemical filling which comprises immersing the opening into a melt metal bath to allow precipitation of a conductive substance, and physical filling method comprising injecting a conductive substance into the opening with pressure, with preference given to an electrolytic plating using a conductive circuit as an electrode for the easiness of processing. Therefore, filling of a conductive substance in the present invention denotes a wide concept inclusive of mechanical filling of conductive substances and the above-mentioned chemical precipitation as well.

While the height of the bump is not particularly limited, it is suitably about 3–30 µm to deal with small semiconductor elements.

The shape of the bump may be any as long as it can make electrical contact with the contact target. For example, it may be like a mushroom (umbrella) as shown in FIG. 1, semi-sphere, prism, column, sphere or cone (e.g., circular cone and pyramid). The shape of the bump on the plane of the insulating substrate may be, for example, triangle, square, rectangle, trapezoid, parallelogram or other polygon.

The presence of bumps contributes to easy positioning of connections and ensured connections with electrodes of semiconductor elements or landing parts of external substrates. Conversely, however, a design not to form the end of a conductive path into a bump but to level same with the surface of the insulating substrate, or form same into concaves, may be adapted according to the shape of the contacting mate, and an optional design may be employed depending on the layout of the semiconductor element and external substrate to be connected to the film carrier, the shape of the circuit and the like.

One embodiment of the semiconductor device is shown in the following, which is obtained by connecting a semiconductor element to the film carrier of the present invention.

Figure 3A:
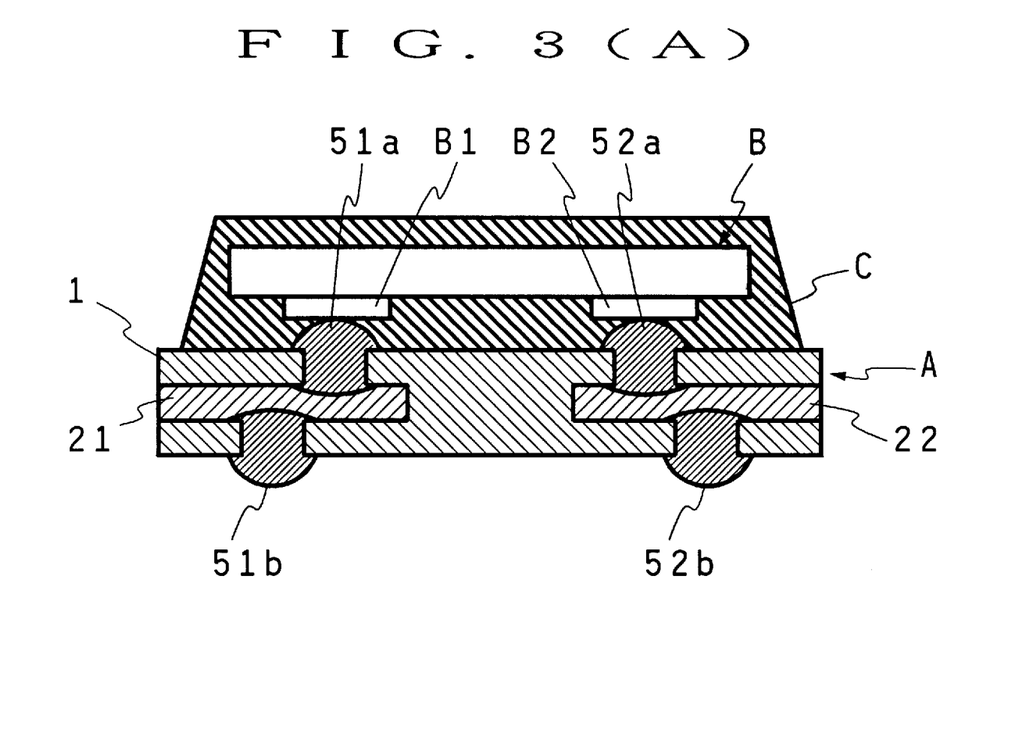
FIG. 3(A) is a schematic cross section of one embodiment of the semiconductor device of the present invention.
Figure 3B:
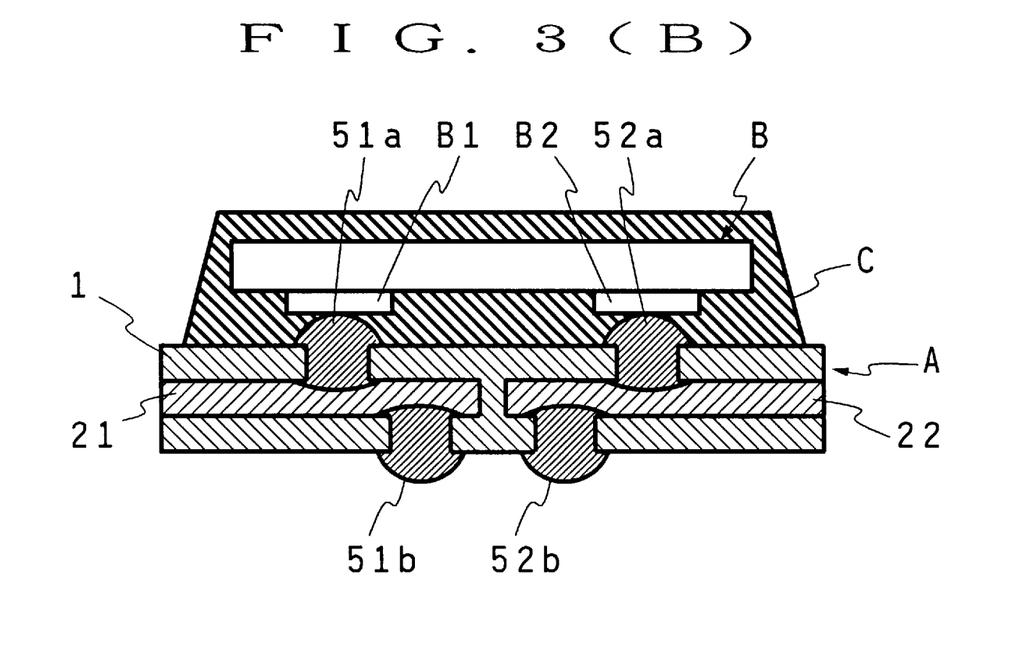
FIG. 3(B) is a schematic cross section of another embodiment of the semiconductor device of the present invention.

FIG. 3(A) and FIG. 3(B) are schematic cross sections of the embodiments of the semiconductor device of the present invention. In these Figures, hatching distinguishes regions. In the embodiments shown in these Figures, a film carrier A has any necessary number of openings on both sides and a conductive path having a bump at the top surface, like the embodiment shown in FIG. 2, wherein a semiconductor element B is connected to one side of the film carrier, and an insulating resin C molds the semiconductor element and almost the entire surface of one side of the film carrier to which the semiconductor element has been connected.

In the film carrier A, conductive circuits 21 and 22 are different systems of insulated circuits, and are embedded in the flexible insulating substrate 1. Bumps 51a and 51b, and 52a and 52b formed on both sides of the insulating substrate 1, are each conducted by conductive circuits 21 and 22, respectively, and the bumps 51a and 52a formed on one side are electrically connected to electrodes B1 and B2, respectively, which have been formed on the semiconductor element B. In addition, the bumps 51a, 51b, 52a and 52b are not formed right behind of respective mating bumps but located in slantwise positions relative to the lengthwise direction of each conductive circuit. The difference between the embodiments of FIG. 3(A) and FIG. 3(B) lies in the locational relationship between the bumps formed on both sides of the substrate 22 in the film carrier A to be used. Specifically, the bumps 51b and 52b exposed on the surface of the semiconductor device are located in slantwise positions relative to the bumps 51a and 52a inside the semiconductor device, toward the outer periphery of substrate in FIG. 3(A) and otherwise in FIG. 3(B). Specifically in the embodiment of FIG. 3(B), the bumps 51b and 52b exposed on the surface of the semiconductor device are located toward the center of the substrate from the bumps 51a and 52a, respectively, thereby advantageously obviating an increase in the area of the film carrier A and decreasing the area occupied by this semiconductor device to the area same as that of the semiconductor element B on the film carrier. This embodiment is particularly preferable because, when a number of semiconductor devices of FIG. 3(B) are mounted at high density to the extent that they are located just next to each other on a mating circuit substrate, for example, a conductor to be formed on the mating circuit substrate, which corresponds to one semiconductor device, does not come too close to the next conductor corresponding to the next semiconductor device, but can desirably secure a sufficient insulating distance.

By connecting the bumps 51a and 52a of the semiconductor device thus formed to the landing part of an external substrate (not shown), the electrodes B1, B2 of the semiconductor element B and the landing part are conducted in the anisotropic direction (thickness direction of insulating layer).

It is therefore possible to impart the beneficial characteristics provided by the above-mentioned action of the film carrier of the present invention to a semiconductor device which is configurated by connecting the semiconductor element to the film carrier of the present invention, whereby the film carrier can realize fine-pitched or highly dense wiring while sufficiently meeting repairability.

A known insulating resin such as epoxy resin and silicone resin can be used for molding and sealing the semiconductor element.

In the present invention, the insulating resin for molding does not come into contact with conductive circuit, but comes into contact with insulating substrate alone to form an interface. In consequence, the film carrier shows superior adhesion to the insulating substrate, thus obviating intrusion of water into the interface, and has greatly improved reliability as a semiconductor device.

A method for producing the semiconductor device of the present invention is described in the following. FIG. 4 schematically shows one embodiment thereof. In the FIGS. (A)–(E), reference numerals for the same parts appearing in the preceding Figures have been omitted. The processing into each shape is as explained in FIG. 1 above.

Figure 4A:
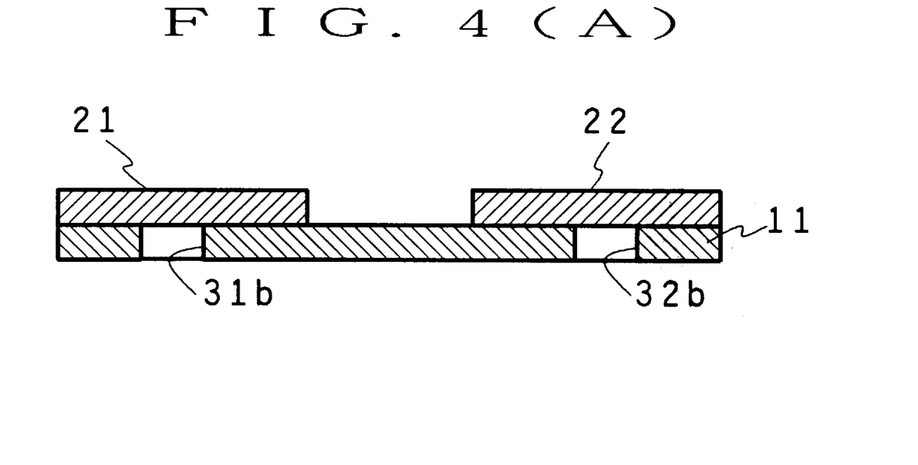
FIGS. 4(A)–4(E) are schematic cross sections of one embodiment of the method of the present invention for producing a semiconductor element.

(1) As shown in FIG. 4(A), the conductive circuits 21 and 22 are formed on one side of a first insulating substrate 11. The conductive circuits may be formed by plating, sputtering, CVD and so on.

Then, through-holes 31b and 32b which reach the surface of the conductive circuit are formed in the area of the insulating substrate where the conductive paths are to be formed by laser processing, and conductive circuits are exposed at the bottom thereof.

Figure 4B:
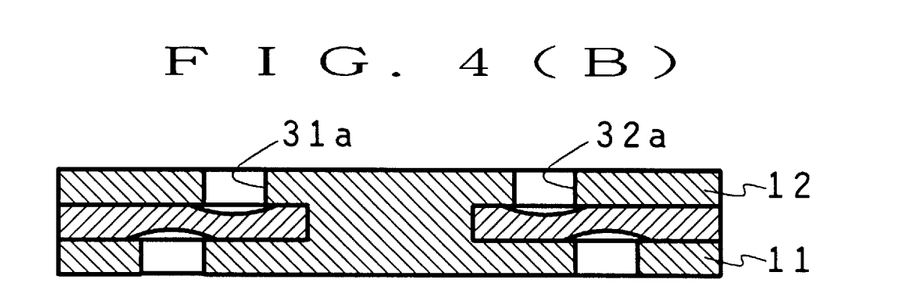

(2) As shown in FIG. 4(B), a second insulating substrate 12 is laminated to cover the both sides of the conductive circuit, whereby the conductive circuit is embedded. The substrate can be laminated by thermal bonding, extrusion forming, casting application and the like. In view of the easiness of production, the conductive circuit is preferable sandwiched between the first and second insulating substrates.

The materials of the first and second insulating substrates may be the same or different.

In the same manner as above, through-holes 31a and 32a which reach the surface of the conductive circuit are formed on the second insulating substrate 12.

Concaves are formed by etching the face of the conductive circuit exposed at the bottom of the through-holes 31a, 31b, 32a and 32b.

Figure 4C:
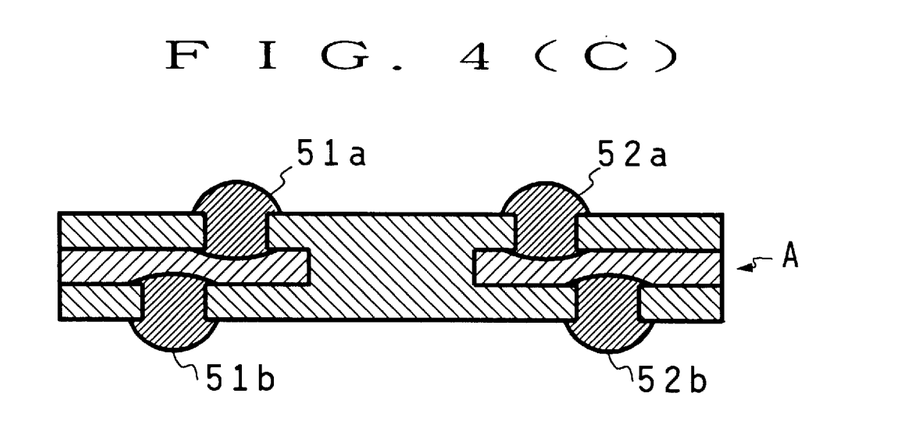

(3) As shown in FIG. 4(C), the openings consisting of a through-hole and a concave are each filled with a conductive material by electrolytic plating to form conductive paths, which is followed by deposition of the material to form bumps 51a, 51b, 52a and 52b, whereby a film carrier A is obtained.

In the above steps (1)–(3), the through-holes 31a, 31b, 32a and 32b may be formed after laminating the first and second insulating substrates.

It is also possible to form an opening on one side to form a bump and then form an opening on the other side.

Figure 4D:
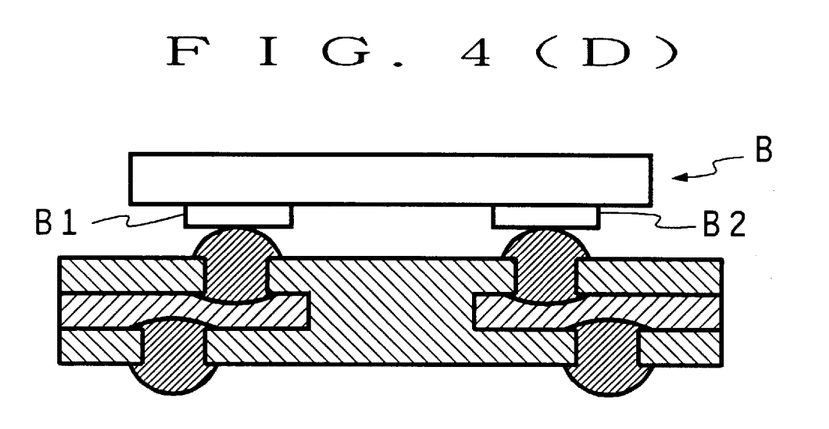

(4) As shown in FIG. 4(D), a semiconductor element B is mounted on the film carrier A, and the bumps 51a and 52a of the film carrier A and electrodes B1 and B2 of the semiconductor element B are connected by thermal bonding. The method for connection may be determined as appropriate according to the kind of metal to be connected, such as ultrasonic bonding and reflow soldering, besides the method used in FIG. 4.

Figure 4E:
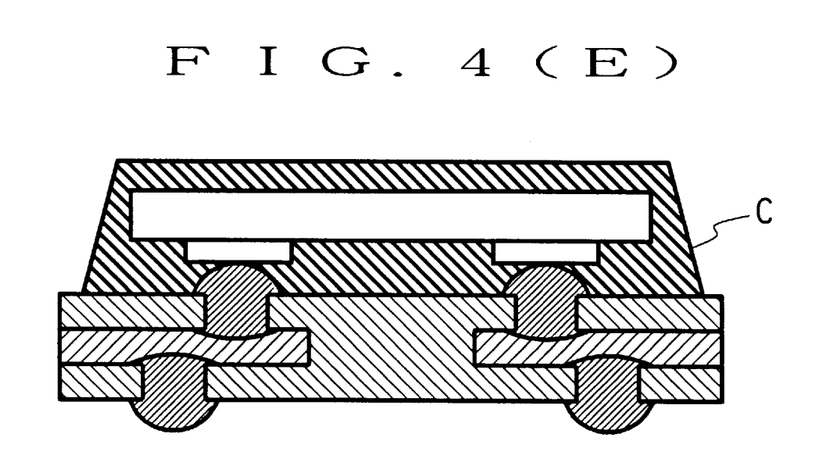

(5) As shown in FIG. 4(E), the area surrounding the semiconductor element B connected to the film carrier A is sealed with an insulating resin C by transfer forming to give the semiconductor device of the present invention.

The method for sealing may be a known method such as potting and casting, besides the method used in FIG. 4.

For example, the semiconductor device of the present invention can be prepared by the following method.
Preparation of circuit substrate A polyimide precursor solution was applied to a 18 $\mu$m thick copper foil, and the solution was dried and cured to form a 13 $\mu$m thick polyimide layer. A thermoplastic polyimide layer was formed thereon in a thickness of 13 $\mu$m. The copper foil was etched in the depth of 1 $\mu$m and a resist layer was formed in a circuit pattern on the copper foil. Then, a 17 $\mu$m thick conductive circuit having a desired circuit pattern was formed by photo-processing. The conductive circuit comprised a 70 $\mu$m side square pad where the following through-hole is to be formed. A polyimide precursor solution was applied to the conductive circuit side, and the solution was dried and cured to form a 10 $\mu$m thick cover coat layer, whereby a circuit substrate was obtained. The cover coat side of the pad was exposed, etched in the depth of 1 $\mu$m to make the thickness of the pad 16 $\mu$m.
Preparation of through-hole A KrF eximer laser beam (transmission wavelength 248 nm) was irradiated through a mask on the thermoplastic polyimide film of the above-mentioned circuit substrate to form a through-hole by dry etching. Thirty sets of through-holes, each set including 208 through-holes, were formed on one circuit substrate. The through-holes in each set were arranged to form a 7 mm side square by making one through-hole at 4 vertexes and 51 through-holes at equal intervals in one side of the square. The squares each drawn with 208 through-holes were arranged in a matrix consisting of 5 squares in the lengthwise direction and 6 squares in the transverse direction. The distance (pitch) between the centers of the neighboring squares was 19 mm (lengthwise) and 13.5 mm (transverse).

Each through-hole was tapered, and the diameter of the opening thereof on the thermoplastic polyimide film was 60 μm and the diameter of the bottom thereof was 50 μm.

Concave formed on conductive circuit

An $O_2$ plasma etching of the through-holes removed decomposed substances left from laser processing in the opening of the through-hole, and on the walls inside the hole, conductive circuit exposed in the through-hole and the like, whereby wettability was improved. In addition, the copper foil exposed at the bottom of the through-hole was subjected to soft etching to form a concave. The soft etching was performed using a soft etching solution containing 100 g of sodium persulfate soft etching agent (PB228, Ebara-Udylite Co., Ltd.) and 100 ml of conc. sulfuric acid in one liter of the soft etching solution. Ultrasonic wave (40 kHz) was applied in this solution for 3 minutes at 30° C.

The size of the concave thus formed was Y in FIG. 1: 5 μm and X in FIG. 1: 3 μm.

Conductive path

The entire circuit substrate was washed with water and subjected to copper plating using the conductive circuit as a negative electrode, whereby copper was dipped to fill the concave and the through-hole. The dipping was continued until the dip protruded 1 μm from the surface of the circuit substrate to form a core of a bump. The core had a gloss mushroom shape. The plating solution used for the copper plating contained 20 ml of a brightener (Thrucup AC90, C. Uyemura & Co., Ltd.) containing 70 g of copper sulfide, 190 g of sulfuric acid, chlorine to 60 ppm, iodide compound and polyethylene glycol in one liter of the plating solution. The plating solution was 25° C., current density was $5A/dm^2$ and plating time was 20 min.

The core was gold-plated to form a bump contact of a 10 μm thick gold film having a hardness of 70HV, whereby the conductive path for the conductive circuit was completed. Each set of through-holes was cut out to give a film carrier of the present invention. The plating solution used for the above-mentioned gold plating was prepared using K710 (Kojima Chemical Reagents, Inc.) as a base solution, and the concentration of the gold was 10 g/l. The plating solution was 65° C., current density was $0.6A/dm^2$ and plating time was 35 min.

The peel strength of the conductive path of the film carrier of the present invention prepared above was determined as follows. That is, a copper plate was plated with solder of tin-lead alloy, the bump contacts of the film carrier were melt-bonded at a sufficient strength, the bump contacts were peeled off and the conductive path was pulled out from the film carrier. The number of samples was 100 sets of through-holes. The inside of the film carrier after pulling out the conductive path was observed. As a result, it was found that the peeling did not occur in the interface between the conductive circuit and the filled metal (i.e., concave surface) but in the conductive circuit in all 100 sets of samples, and the conductive path was pulled out from the film carrier with a part of the conductive circuit sticking thereto. The result confirmed the sufficient adhesion strength of the metal filled therein to the conductive circuit.

For comparison, a film carrier was prepared under the following different conditions. That is, the time of the soft etching for forming a concave was shortened to 0.5 minute to change Y to 1 μm and X to 0.5 μm. Along therewith, the time for copper plating for forming a conductive path was shortened to 18 minutes. Other conditions were the same. The copper core of the bump protruded 1 μm from the surface of the circuit substrate and the gold film thereon was the same as in the above-mentioned Example.

The peel strength of the film carrier prepared for comparison was determined with regard to 100 sets of samples as in the above Example. As a result, 85 sets showed complete destruction at the conductive circuit in all 208 through-holes contained therein as in the above Example, and 15 sets showed peeling at the interface between the conductive circuit and the filled metal in one or more holes of 208 through-holes.

It was confirmed from the comparison of the above Example and comparative example that the particularly preferable range of X and Y of a concave in terms of peel strength of conductive circuit and the filled metal was the range defined by the present invention.

As described in the foregoing, the film carrier of the present invention can cope with a fine-pitched and high dense mounting, while prohibiting pulling out of the conductive path to be the contact part by an external force. Therefore, a conductive circuit and a conductive path do not separate upon connection with an electrode of a semiconductor element or a landing part of an external substrate, or upon detachment of the connection for repair action. Accordingly, the film carrier is devoid of fallout of the conductive path, which in turn increases electrical connection reliability.

The use of the film carrier of the present invention for the semiconductor device imparts the action and effect of the film carrier to the semiconductor element, thereby enabling fine-pitched and high dense mounting, while affording repairability.

What is claimed is:

1. A film carrier comprising:

a conductive circuit formed inside an insulating substrate, wherein the insulating substrate is made from a thermosetting resin or thermoplastic resin, has a thickness of 2–500 μm, and has flexibility;

and the insulating substrate having at least one opening on at least one side thereof where the conductive circuit is formed; wherein the opening comprises a through-hole that extends from a surface of the substrate to a surface of the conductive circuit and wherein the conductive circuit has a concave face about the opening at a lower end of the through-hole, in a diameter equally extended all around said opening, and wherein the opening is filled with a conductive material to form a conductive path, and wherein the concave face satisfies the following:

(A) $Y \leq Z/2$, wherein, considering a cross-sectioned thickness of the substrate and the conductive path, Y is a length of the conductive circuit from the through-hole lower end to a concave-most point of the concave face, and Z is a thickness of the conductive circuit at a point other than where the conductive circuit has the concave face;

(B) $X \leq W/2$, wherein X is a distance from the through-hole lower end to an outer periphery of the concave face at a point where the concave face of the conductive circuit contacts the substrate, and W is a distance from the through-hole lower edge extended linearly along X to a point where the conductive circuit ends; and (C) $1/3 \leq X/Y \leq 1$, wherein openings are formed on both sides of the insulating substrate, and conductive paths of a desired combination are conducting each other via conductive circuits.

2. The film carrier of claim 1, wherein the through-hole of the insulating substrate is formed by laser processing and the concave of the conductive circuit is formed by chemical etching.

3. The film carrier of claim 1, wherein the conductive path protrudes from the surface of the insulating substrate.

4. A film carrier according to claim 3, wherein the protusion has a height of 3–30 $\mu$m.

5. The film carrier of claim 1, wherein the conductive material is filled in the opening by electrolytic plating or electroless plating.

6. A film carrier according to claim 3, wherein the size of the opening on the surface of the insulating substrate is 5–200 $\mu$m.

7. A film carrier according to claim 1, wherein the thickness of the conductive circuit is 1–200 $\mu$m.

8. A semiconductor device comprising a film carrier comprising:

a conductive circuit formed inside an insulating substrate, wherein the insulating substrate is made from a thermosetting resin or thermoplastic resin, has a thickness of 2–500 $\mu$m, and has flexibility;

and the insulating substrate having at least one opening on at least one side thereof where the conductive circuit is formed; wherein the opening comprises a through-hole that extends from a surface of the substrate to a surface of the conductive circuit and wherein the conductive circuit has a concave face about the opening at a lower end of the through-hole, in a diameter equally extended all around said opening, and wherein the opening is filled with a conductive material to form a conductive path, and wherein the concave face satisfies the following:

(A) $Y \leq Z/2$, wherein, considering a cross-sectioned thickness of the substrate and the conductive path, Y is a length of the conductive circuit from the through-hole lower end to a concave-most point of the concave face, and Z is a thickness of the conductive circuit at a point other than where the conductive circuit has the concave face;

(B) $X \leq W/2$, wherein X is a distance from the through-hole lower end to an outer periphery of the concave face at a point where the concave face of the conductive circuit contacts the substrate, and W is a distance from the through-hole lower edge extended linearly along X to a point where the conductive circuit ends; and (C) $1/3 \leq X/Y \leq 1$ wherein an electrode of a semiconductor element is connected to a contact part of the conductive path of the film carrier.

9. The semiconductor device of claim 8, wherein the film carrier has an electrode for connection with an external device, and further provided that the semiconductor device, except for the electrode, is molded with an insulating resin.

* * * * *